(12) United States Patent
Sadjadi et al.

(10) Patent No.: US 8,986,492 B2
(45) Date of Patent: Mar. 24, 2015

(54) SPACER FORMATION FOR ARRAY DOUBLE PATTERNING

(75) Inventors: S. M. Reza Sadjadi, Saratoga, CA (US); Amit Jain, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 612 days.

(21) Appl. No.: 13/369,651

(22) Filed: Feb. 9, 2012

(65) Prior Publication Data

US 2012/0138227 A1  Jun. 7, 2012

Related U.S. Application Data

(62) Division of application No. 12/351,640, filed on Jan. 9, 2009, now Pat. No. 8,138,092.

(51) Int. Cl.
| C23F 1/00 | (2006.01) |
| H01L 21/306 | (2006.01) |
| H01L 21/033 | (2006.01) |

(52) U.S. Cl.
CPC .................................. H01L 21/0337 (2013.01)
USPC .................................................... 156/345.26

(58) Field of Classification Search
USPC ............. 156/345.24, 345.26, 345.48, 345.49; 118/715, 722, 723 R, 723 I, 723 IR; 438/694, 696, 710, 717; 700/95, 117, 700/121
See application file for complete search history.

(56) References Cited

U.S. PATENT DOCUMENTS

| 7,253,118 B2 | 8/2007 | Tran et al. |
| 2006/0211260 A1 | 9/2006 | Tran et al. |
| 2006/0240362 A1 | 10/2006 | Sandhu et al. |
| 2007/0049040 A1 | 3/2007 | Bai et al. |
| 2007/0117742 A1 | 5/2007 | Opstelten et al. |
| 2007/0238053 A1 | 10/2007 | Hashimoto |

(Continued)

FOREIGN PATENT DOCUMENTS

| JP | 2007-305970 | 11/2007 |
| KR | 10-2007-0051196 | 5/2007 |
| KR | 10-2007-0116108 | 12/2007 |

(Continued)

OTHER PUBLICATIONS

International Search Report dated Jul. 29, 2010 from International Application No. PCT/US2009/069292.

(Continued)

Primary Examiner — Maureen Gramaglia
(74) Attorney, Agent, or Firm — Beyer Law Group LLP

(57) ABSTRACT

A method for forming an array area with a surrounding periphery area, wherein a substrate is disposed under an etch layer, which is disposed under a patterned organic mask defining the array area and covers the entire periphery area is provided. The patterned organic mask is trimmed. An inorganic layer is deposited over the patterned organic mask where a thickness of the inorganic layer over the covered periphery area of the organic mask is greater than a thickness of the inorganic layer over the array area of the organic mask. The inorganic layer is etched back to expose the organic mask and form inorganic spacers in the array area, while leaving the organic mask in the periphery area unexposed. The organic mask exposed in the array area is stripped, while leaving the inorganic spacers in place and protecting the organic mask in the periphery area.

17 Claims, 17 Drawing Sheets

(56) References Cited

U.S. PATENT DOCUMENTS

2007/0264830 A1  11/2007  Huang et al.
2008/0057692 A1   3/2008  Wells et al.

FOREIGN PATENT DOCUMENTS

| KR | 10-0875662 | 12/2008 |
| TW | 200643609 | 12/2006 |
| TW | 200745629 | 12/2007 |
| TW | 200832508 | 8/2008 |

OTHER PUBLICATIONS

Written Opinion dated Jul. 29, 2010 from International Application No. PCT/US2009/069292.
Notice of Allowance dated Nov. 9, 2011 from U.S. Appl. No. 12/351,640.
Office Action dated Jun. 9, 2011 from U.S. Appl. No. 12/351,640.
Taiwan Search Report dated Dec. 2, 2014 from Taiwan Application No. 099100420.

SPACER FORMATION FOR ARRAY DOUBLE PATTERNING

CROSS REFERENCE TO RELATED APPLICATIONS

This application is a divisional of and claims priority under 35 U.S.C. §120 to U.S. patent application Ser. No. 12/351,640, now U.S. Pat. No. 8,138,092, filed on Jan. 9, 2009 and entitled "Spacer Formation For Array Double Patterning" which is incorporated by reference herein for all purposes.

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

SUMMARY OF THE INVENTION

To achieve the foregoing and in accordance with the purpose of the present invention, a method for forming an array area with a surrounding periphery area, wherein a substrate is disposed under an etch layer, which is disposed under a patterned organic mask defining the array area and the periphery area is provided. The patterned organic mask is trimmed. An inorganic layer is deposited over the patterned organic mask where a thickness of the inorganic layer over the periphery area of the organic mask is greater than a thickness of the inorganic layer over the array area of the organic mask. The inorganic layer is etched back to expose the organic mask and form inorganic spacers in the array area, while leaving the organic mask in the periphery area unexposed. The organic mask exposed in the array area is stripped, while leaving the inorganic spacers in place and protecting the organic mask in the periphery area.

In another manifestation of the invention, an apparatus for forming an array area with a surrounding periphery area, wherein a substrate is disposed under an etch layer, which is disposed under a patterned organic mask defining the array area and the periphery area is provided. A plasma processing chamber is provided, comprising a chamber wall forming a plasma processing chamber enclosure, a substrate support for supporting a substrate within the plasma processing chamber enclosure, a pressure regulator for regulating the pressure in the plasma processing chamber enclosure, at least one antenna for providing power to the plasma processing chamber enclosure for sustaining a plasma, at least one bias electrode for providing a bias voltage, a gas inlet for providing gas into the plasma processing chamber enclosure, and a gas outlet for exhausting gas from the plasma processing chamber enclosure. A gas source is in fluid connection with the gas inlet and comprises a trimming gas source, an inorganic layer deposition gas source, an etch back gas source, and a stripping gas source. A controller is controllably connected to the gas source, the at least one antenna, and at least one bias electrode and comprises at least one processor and computer readable media. The computer readable media comprises computer readable code for trimming the patterned organic mask, computer readable code for depositing an inorganic layer over the patterned organic mask where a thickness of the inorganic layer over the periphery area of the organic mask is greater than a thickness of the inorganic layer over the array area of the organic mask, computer readable code for etching back the inorganic layer to expose the organic mask and form inorganic spacers in the array area, while leaving the organic mask in the periphery area unexposed, and computer readable code for stripping the organic mask exposed in the array area, while leaving the inorganic spacers in place and protecting the organic mask in the periphery area.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
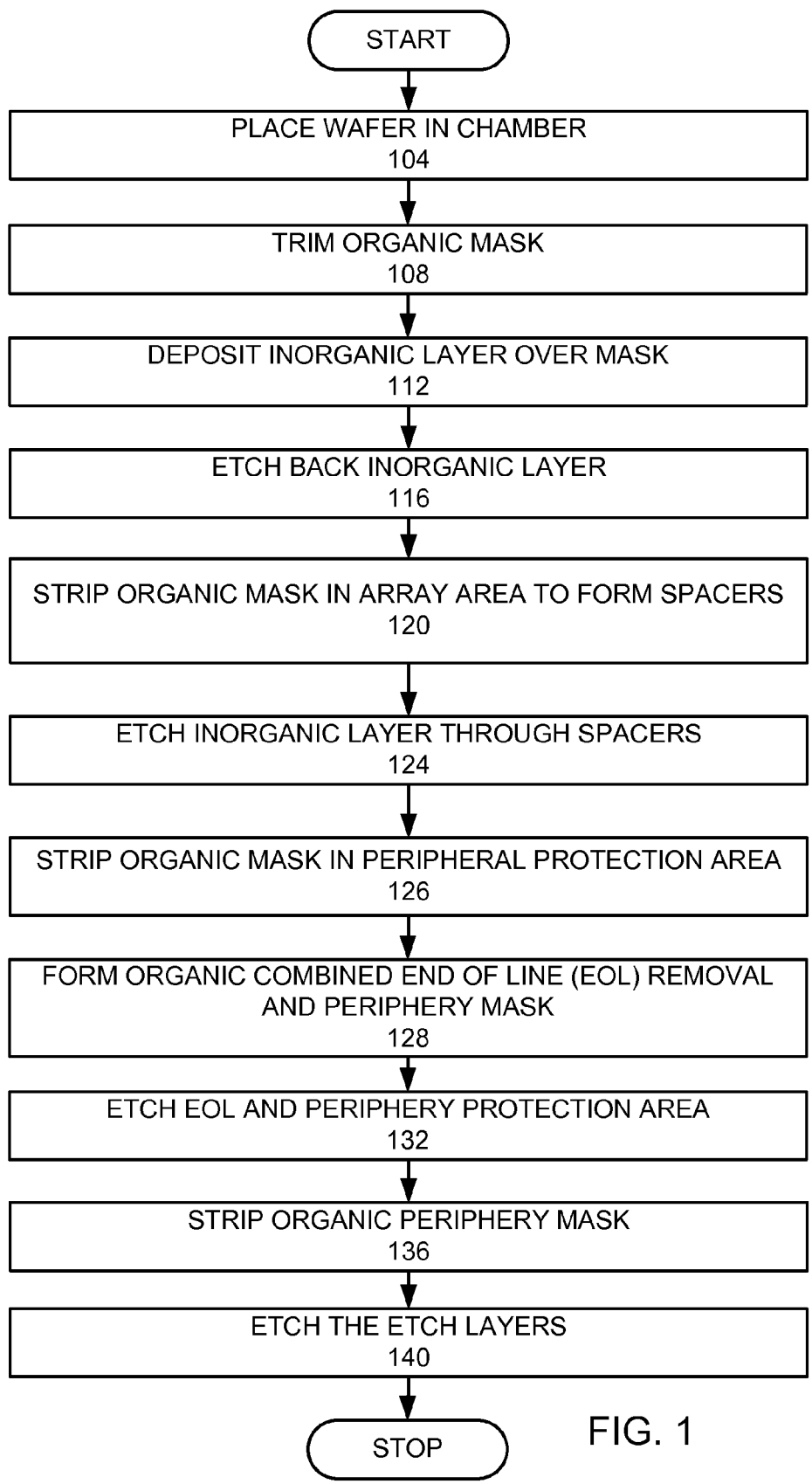
FIG. 1 is a high level flow chart of a process that may be used in an embodiment of the invention.

To facilitate understanding, FIG. 1 is a high level flow chart of a process that may be used in an embodiment of the invention, which provides a method for etching an array area and a periphery area of an inorganic etch layer. A wafer disposed under an inorganic etch layer disposed under an inorganic mask layer, which is disposed under a patterned organic mask, where the organic patterned mask defines an array area and a periphery area is placed into an inductively coupled TCP chamber (step 104). The organic patterned mask is trimmed with a lateral trim (step 108). An inorganic layer is deposited over the organic mask layer (step 112). This deposition provides a greater thickness over the periphery area of the organic mask than over the array area of the organic mask. The inorganic deposition layer is then etched back so that the organic mask in the array area is exposed, while the organic mask in the periphery area is unexposed (step 116). Exposing only the organic mask in the array area while leaving the organic mask in the periphery area is enabled by providing a thicker deposition over the periphery area than the array area. The etching back of the inorganic deposition layer causes the formation of spacers in the array area adjacent to the lines of the organic mask. The organic mask is stripped only in the array area leaving the spacers of the inorganic deposition layer in only the array area (step 120). The reason that the organic mask is only stripped in the array area is because the previous step caused the organic mask in the array area to be exposed, while the organic mask in the periphery array area is unexposed. The spacers are used as an etch mask to etch an inorganic layer, while the periphery area is protected from being etched (step 124). This etch may also etch away the remaining deposited inorganic layer over the periphery area. Since the deposited organic layer over the periphery area is etch away, the organic mask over the periphery area may be stripped away (step 126) with a strip. A patterned organic end of the line (EOL) removal and periphery protection mask is then formed over the wafer (step 128). The patterned organic end of the line (EOL) removal and periphery protection mask exposes the doubled end of the lines and the periphery area to allow removal of the EOL which short the adjacent array lines and also etching of the periphery area, but covers the rest of the array area. The patterned combined (integrated) organic EOL and periphery protection area mask may expose part of the array area to allow end of line etching in the array area. In this way, since both EOLs and periphery are etched using a single mask, significant cost savings due to elimination of a lithography step can be realized. Subsequent etch steps are performed (step 132), which etches portions of the inorganic layer in the periphery area and array area that are exposed by the organic EOL and periphery protection area mask. The organic EOL and periphery protection mask is stripped (step 136). The etch layer is then etched (step 140).

EXAMPLE

Figure 2A:
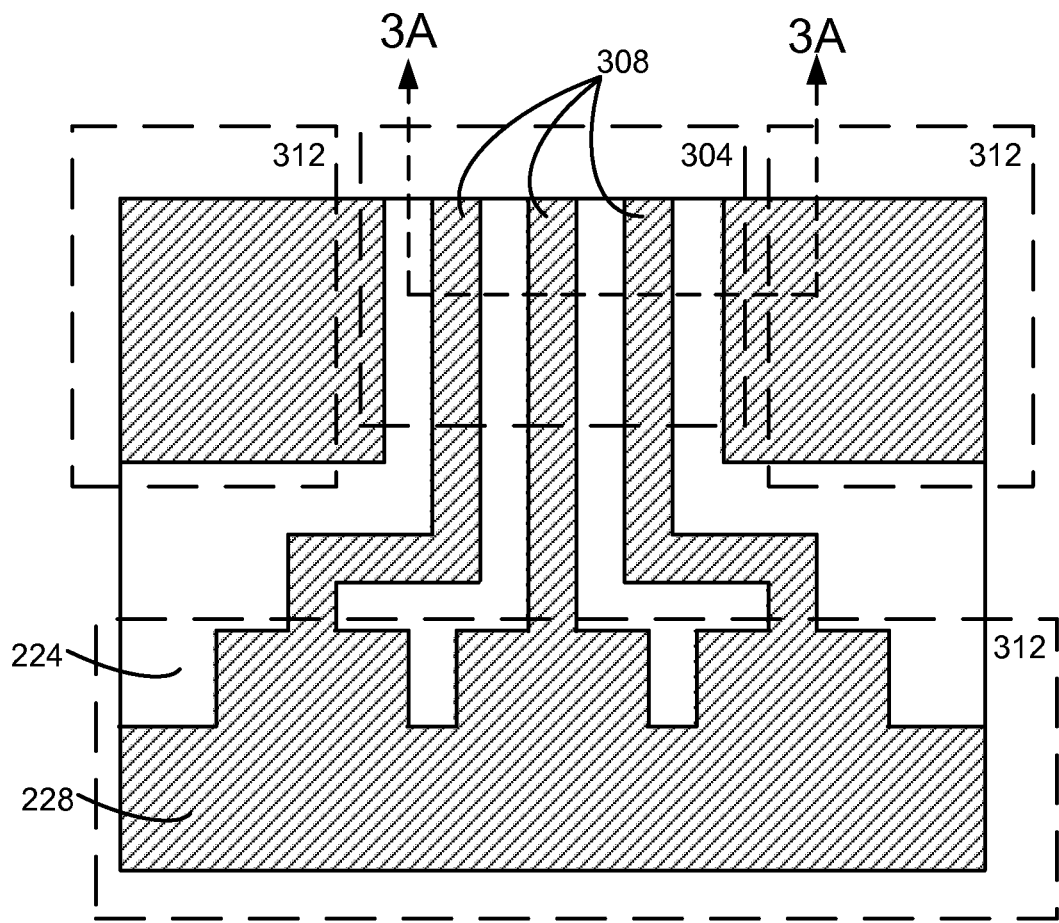
FIGS. 2A-L are top views of part of an example of a silicon wafer processed according to an embodiment of the invention.
Figure 3A:
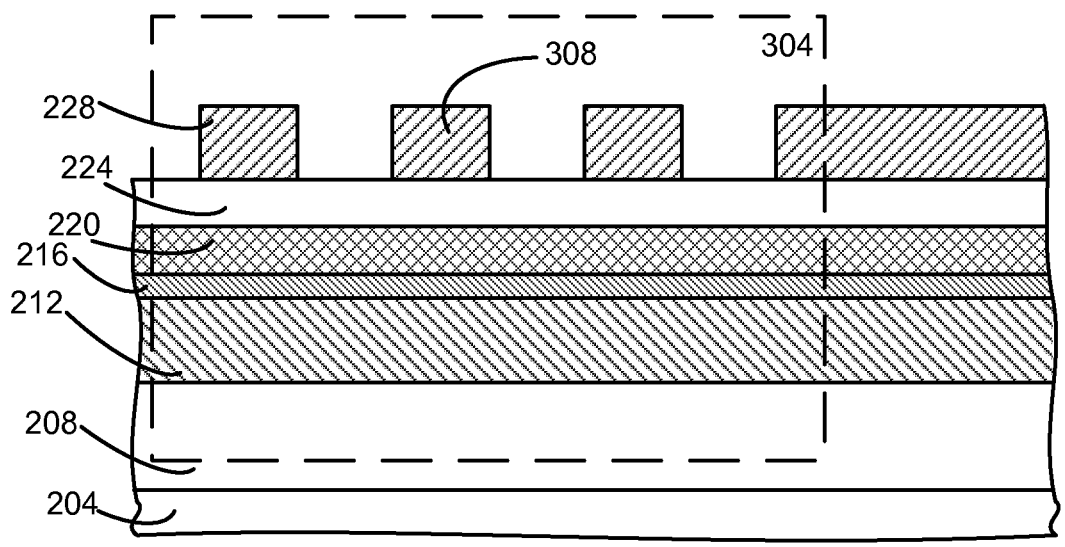
FIGS. 3A-L are enlarged cross-sectional view of FIGS. 2A-L.

In an example of an implementation of the invention, a wafer is provided. FIG. 2A is a top view of part of an example of a silicon wafer. FIG. 3A is an enlarged cross-sectional view along cut lines 3A-3A of the silicon wafer 204 over which a silicon nitride (SiN) layer 208 is formed, over which an amorphous carbon layer 212 is formed, over which a pad oxide layer 216 is formed, over which a second SiN layer 220 is formed, over which a bottom antireflective coating (BARC) 224 is formed, over which a patterned organic mask (228) is formed. The top view in FIG. 2A shows the patterned organic mask 228, which is shaded, and the exposed BARC 224, which is unshaded. The patterned organic mask 228 defines an array area 304 defined by lines 308 which are relatively thin and with a denser line pattern and a periphery area 312, with large covered areas instead of denser line patterns.

Figure 4:
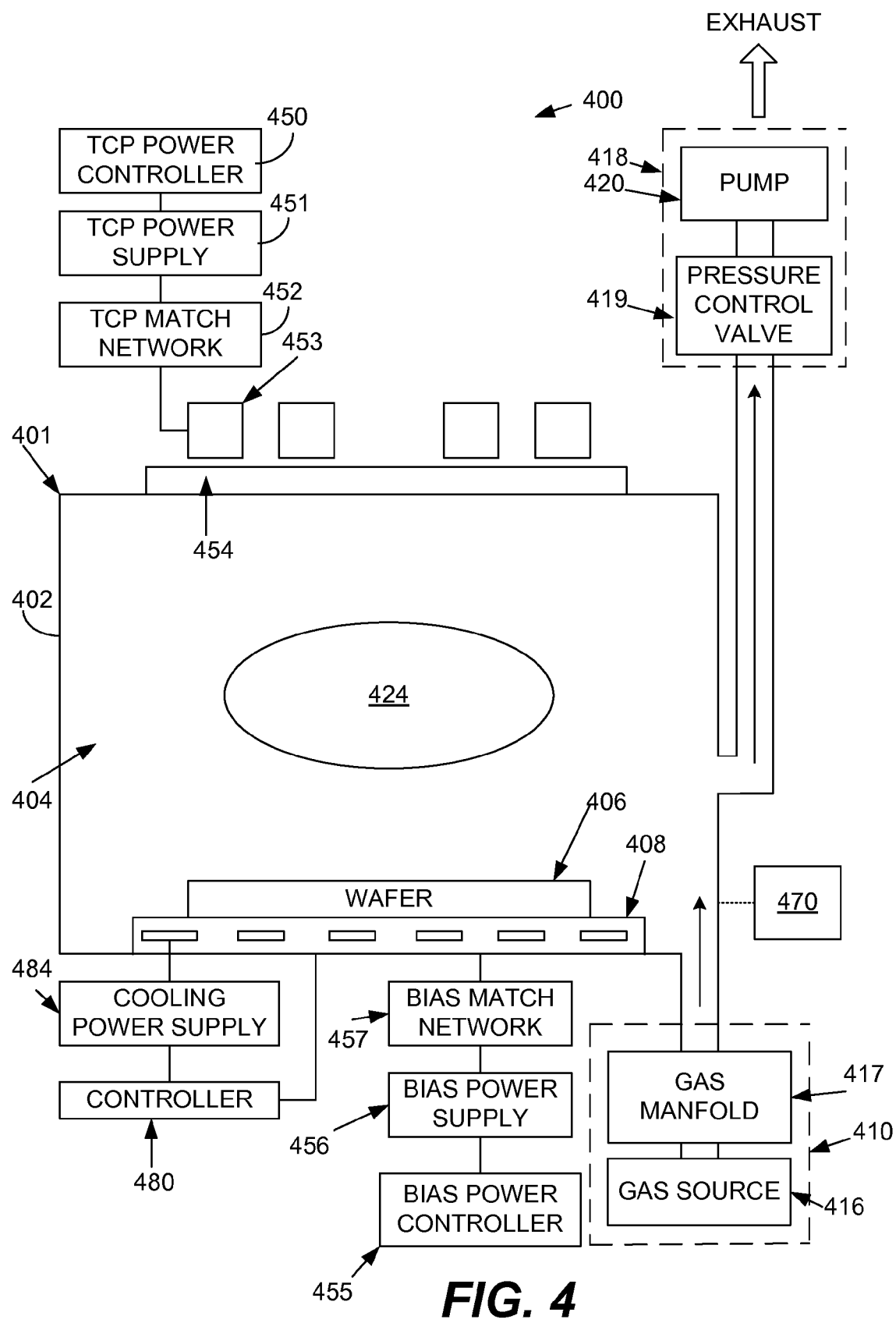
FIG. 4 illustrates a processing tool that may be used in an implementation of the invention.

The wafer 204 may be placed in a process chamber (step 104). FIG. 4 illustrates a processing tool that may be used in an implementation of the invention. FIG. 4 is a schematic view of a plasma processing system 400, including a plasma processing tool 401. The plasma processing tool 401 is an inductively coupled plasma etching tool and includes a plasma reactor 402 having a plasma processing chamber 404 therein. A transformer coupled power (TCP) controller 450 and a bias power controller 455, respectively, control a TCP power supply 451 and a bias power supply 456 influencing the plasma 424 created within plasma chamber 404.

The TCP power controller 450 sets a set point for TCP power supply 451 configured to supply a radio frequency signal at 13.56 MHz, tuned by a TCP match network 452, to a TCP coil 453 located near the plasma chamber 404. An RF transparent window 454 is provided to separate TCP coil 453 from plasma chamber 404 while allowing energy to pass from TCP coil 453 to plasma chamber 404.

The bias power controller 455 sets a set point for bias power supply 456 configured to supply an RF signal, tuned by bias match network 457, to a chuck electrode 408 located within the plasma chamber 404 creating a direct current (DC) bias above electrode 408 which is adapted to receive a substrate 406, such as a semi-conductor wafer work piece or an etch layer on the wafer, being processed.

A gas supply mechanism or gas source 410 includes a source or sources of gas or gases 416 attached via a gas manifold 417 to supply the proper chemistry required for the process to the interior of the plasma chamber 404. A gas exhaust mechanism 418 includes a pressure control valve 419 and exhaust pump 420 and removes particles from within the plasma chamber 404 and maintains a particular pressure within plasma chamber 404.

A temperature controller 480 controls the temperature of a cooling recirculation system provided within the chuck electrode 408 by controlling a cooling power supply 484. The plasma processing system also includes electronic control circuitry 470. The plasma processing system may also have an end point detector.

Figure 5A:
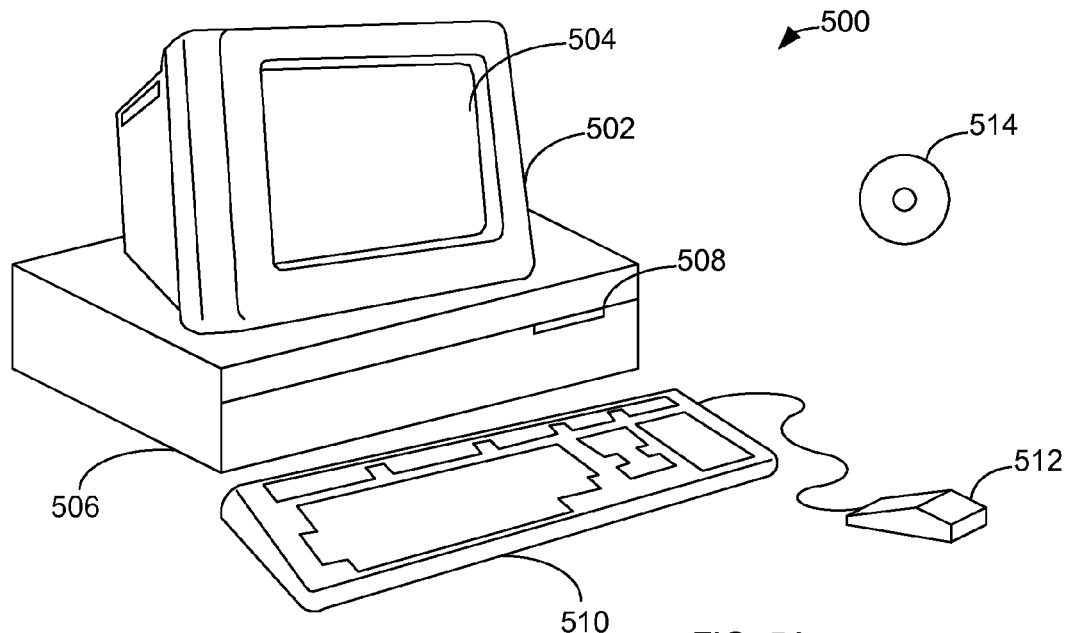
FIGS. 5A and 5B illustrate a computer system, which is suitable for implementing a controller for control circuitry used in embodiments of the present invention.
Figure 5B:
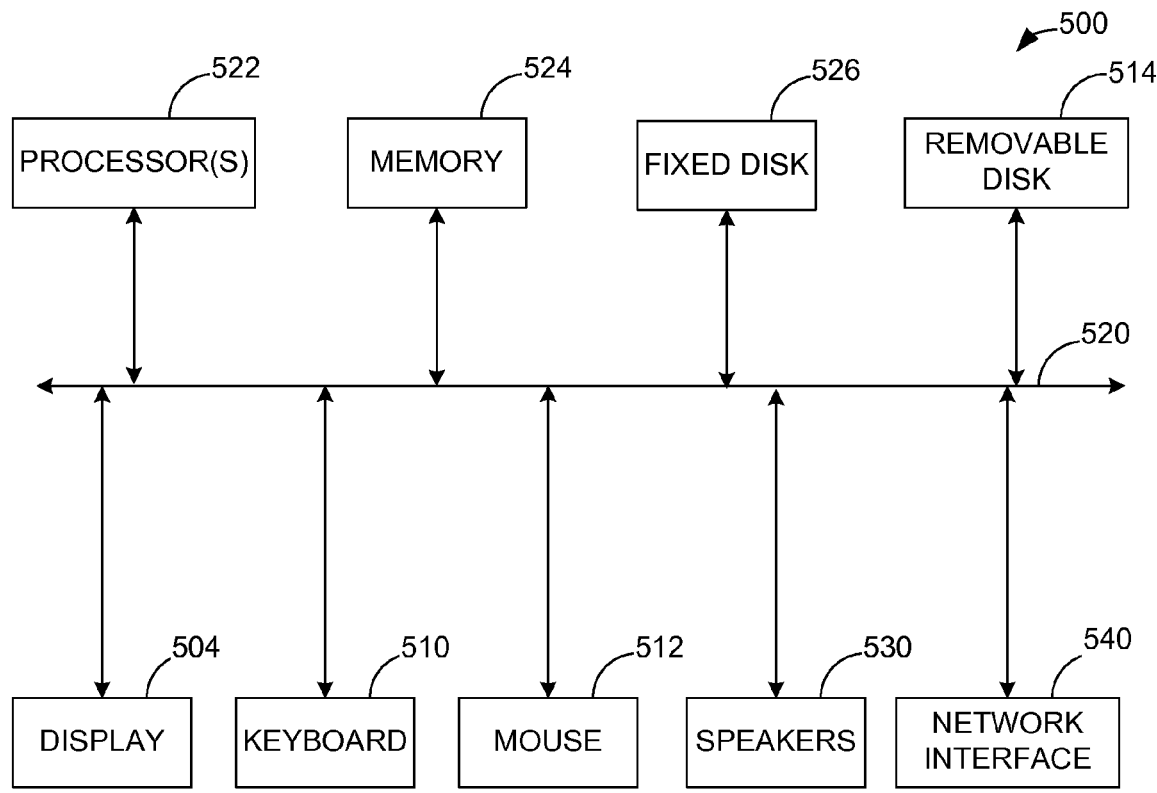

FIGS. 5A and 5B illustrate a computer system 500, which is suitable for implementing a controller for control circuitry 470 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 is a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of any of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
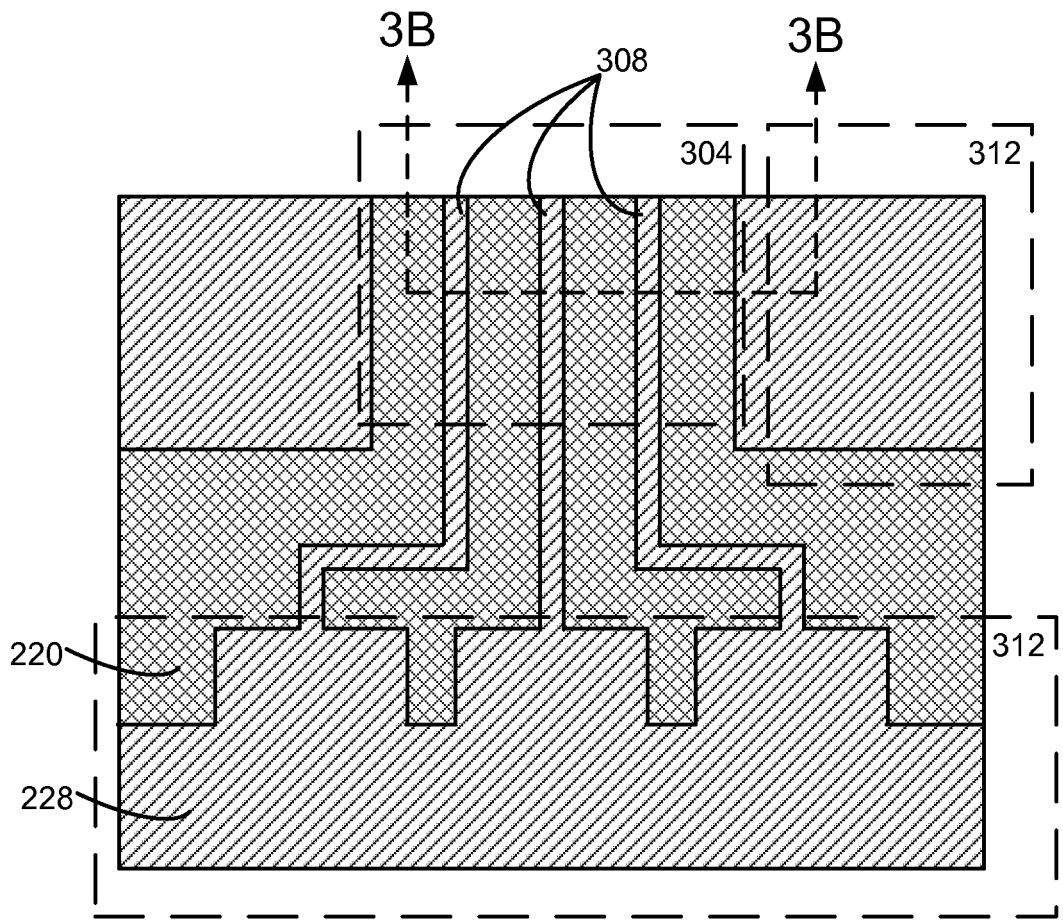
Figure 3B:
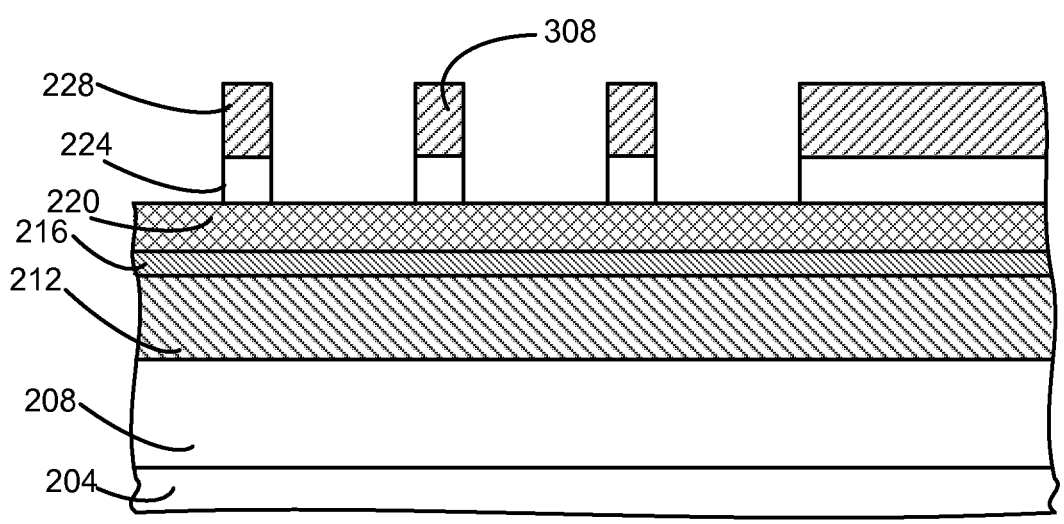

In the process chamber, the patterned organic mask 228 is trimmed (step 108). The trim provides a lateral etch of the patterned organic mask 228. FIG. 2B is a top view and FIG. 3B is a cross-sectional view of part of the wafer after patterned organic mask 228 is trimmed. As can be seen, the mask lines are made thinner. In this example, the mask lines are trimmed to be thinner by more than 25%. In this example, trimming the patterned organic mask also etches through the BARC 224, so that parts of the SiN layer 220 is exposed.

Figure 2C:
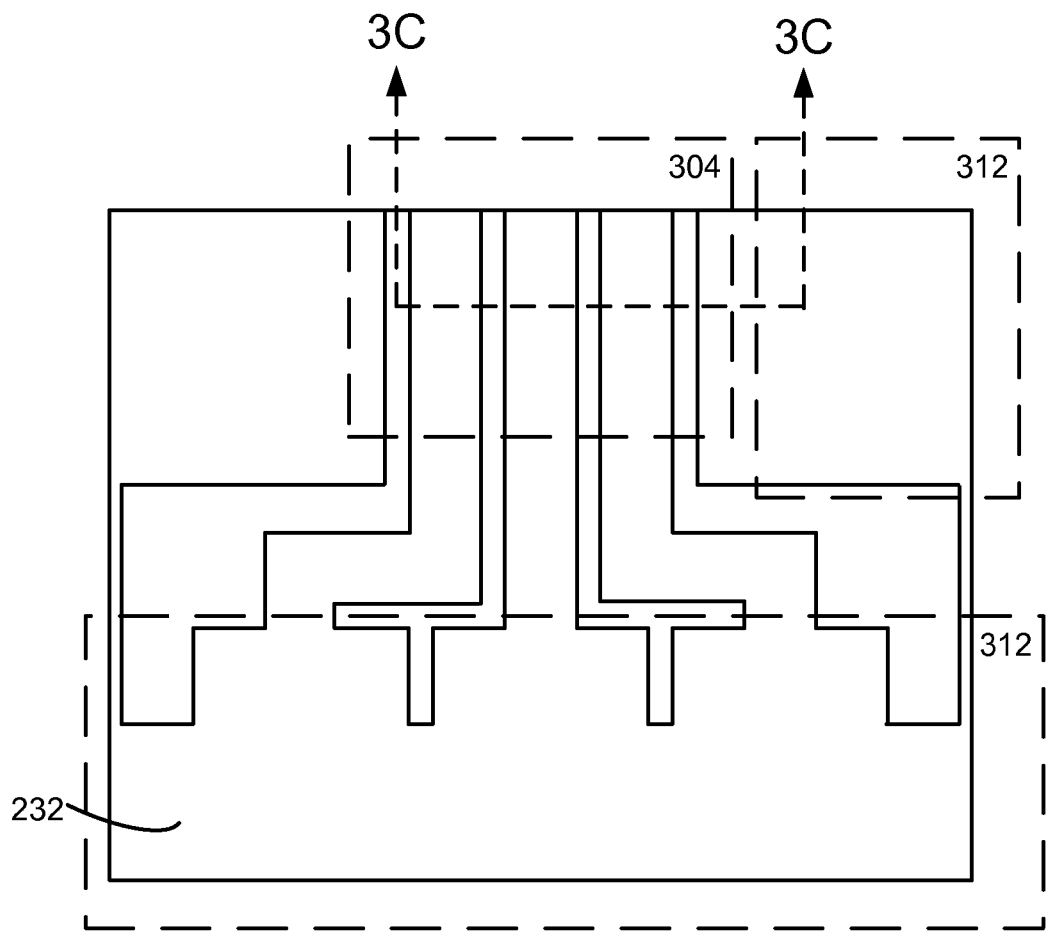
Figure 3C:
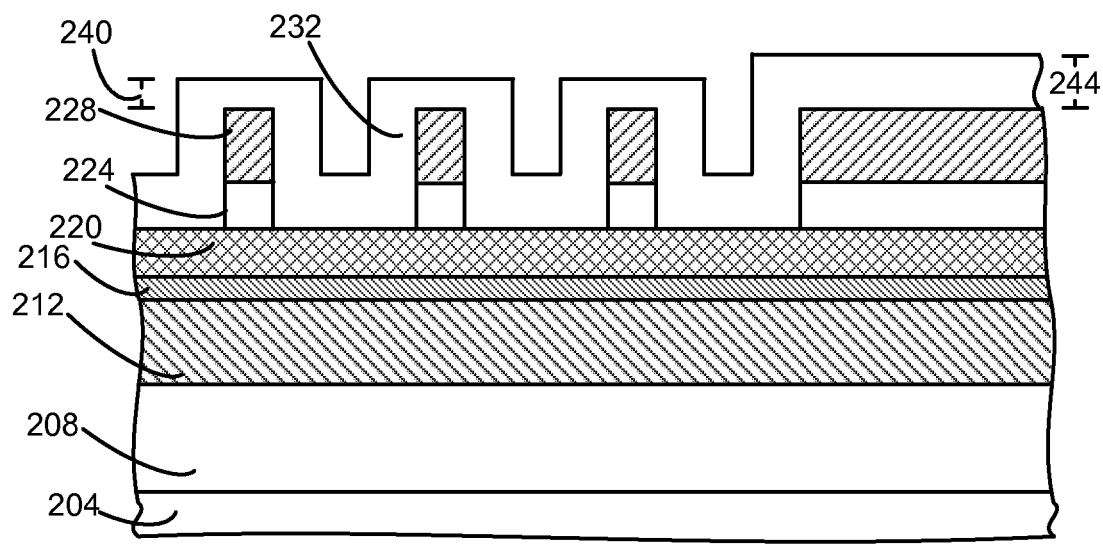

A deposited inorganic layer is deposited over the patterned organic layer (step 112) where the thickness of the deposited inorganic layer over the periphery area of the organic mask is greater than the thickness of the deposited inorganic layer over the array area of the organic mask. In this example, the deposited inorganic layer is made of a silicon oxide based material. FIG. 2C shows a top view and FIG. 3C shows a cross-sectional view after a silicon oxide layer 232 is deposited over the wafer. In the top view, FIG. 2C, the entire surface is covered with the deposited silicon oxide layer 232. The lines are contour lines. It should be noted that the thickness 240 of the deposited silicon oxide layer 232 over the top of the organic patterned mask in the array area is thinner than the thickness 244 of the deposited silicon oxide layer 232 over patterned organic mask of the periphery area 312.

Although the deposition is shown as having sharp corners, other depositions may have rounded corners. The sharp corners are shown in this example for simplicity.

Figure 6:
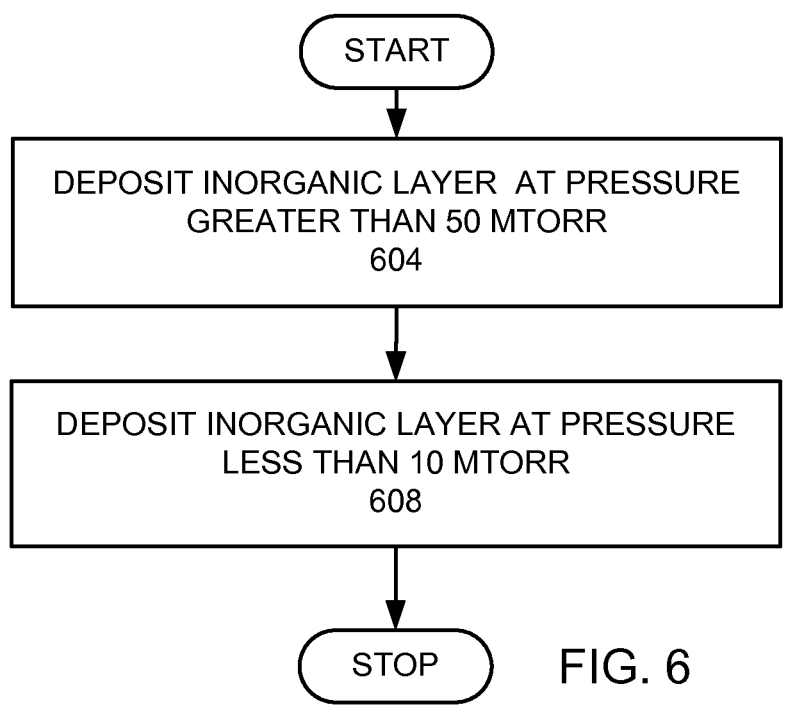
FIG. 6 is a flow chart of a two step process for depositing an inorganic layer used in an embodiment of the invention.

In one embodiment of the invention, a two step deposition process is used to provide the deposited silicon oxide layer where the thickness of the deposited silicon oxide layer on the mask over the array area is thinner than the thickness of the deposited silicon oxide layer on the mask over the periphery area. FIG. 6 is a flow chart of the two step process. In the first step, the deposited inorganic layer is first deposited over the patterned mask using a process pressure of greater than 50 mTorr (step 604). Next, the deposited inorganic layer is deposited at a pressure less than 10 mTorr (step 608). An example of such a recipe, the first step (step 604) provides a process pressure of 100 mT with 400 watts TCP. A deposition gas of 50 sccm $SiCl_4$, 50 and sccm $O_2$ is provided. An electrostatic chuck temperature of 15° C. is provided. The process is maintained for 5 seconds. The second step provides a process pressure of 5 mTorr with 400 watts TCP. A deposition gas of 50 sccm $SiCl_4$ and 50 sccm $O_2$ is provided. An electrostatic chuck temperature of 15° C. is maintained. The process is maintained for 10 seconds. In this specific example, the deposition chemistries for each of these two deposition steps are identical. More generally, all of the process parameters are the same, except for the different process pressures.

Figure 7A:
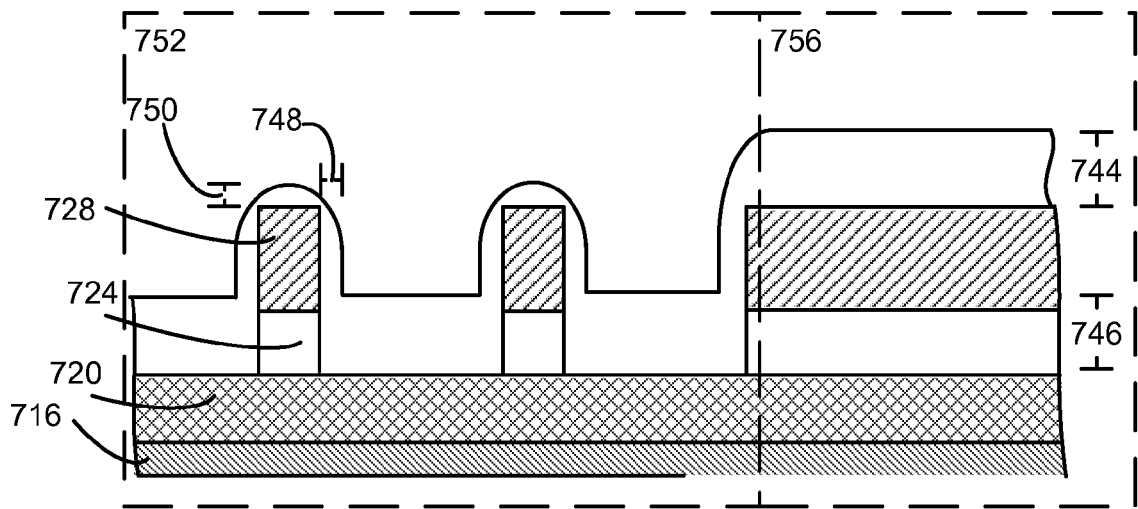
FIGS. 7A-B are schematic cross-sectional views of part of a stack processed according the process of FIG. 6.

FIG. 7A is a schematic cross-sectional view of part of a stack after the first deposition step (step 604). In this example an etch layer 716 is covered by a hardmask layer 720, over which a patterned BARC layer 724 and photoresist mask 728 has been provided, which define a array area 752 and a periphery area 756. The first step of the deposition has deposited a silicon oxide layer with a process pressure of greater than 50 mTorr. This step forms a relatively thick deposition on the horizontal surfaces on top of the patterned mask in the periphery area with a thickness 744 and at the bottom of features in the array area with a thickness 746. This step provides a thinner deposition on the sidewalls, with a thickness 748. In one example the thickness of the sidewalls may be less than half the thickness of the deposited inorganic layer over the mask over the periphery area mask. Because the line patterns in the array area are so thin, the thinness of the deposited layer sidewalls influences the thickness of the deposition on the line patterns, so that the thickness on top of the lines in the array area with a thickness 750 is thinner than the deposition on top of the mask in the periphery area with a thickness 744. This step alone would provide sidewalls that are too thin.

Figure 7B:
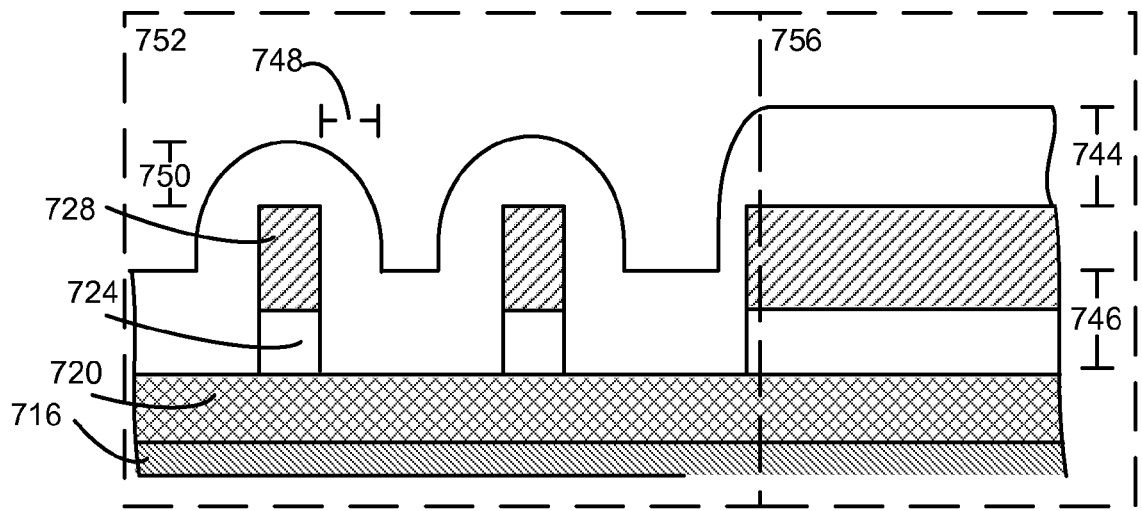

FIG. 7B is a schematic cross-sectional view of part of a stack after the second deposition step (step 608). The second step of the deposition has deposited a silicon oxide layer with a process pressure of less than 10 mTorr. This step more evenly forms a deposition on the horizontal surfaces on top of the patterned mask in the periphery area, at the bottom of features in the array area, on the sidewalls, and on horizontal surfaces of the patterned mask in the array area. Therefore the additional thickness due to the second step on the horizontal surfaces on top of the patterned mask in the periphery area of the deposition layer is less than one and a half times the additional thickness due to the second step on the sidewall. This step alone would cause the thickness of the deposition on top of the mask 750 in the array area to be about the same as the thickness of the deposition on top of the mask 744 in the periphery area, which would not allow for the subsequent etch back which exposes the mask in the array area, but protects the mask in the periphery area. This two step process provides sufficiently thick sidewalls, while providing a thinner deposition thickness on top of the mask in the array area 752 compared to the thickness in the periphery area.

In other embodiments, the first deposition step is performed using a process pressure range of 50-200 mTorr and the second deposition step is performed using a process pressure in the range of 1-10 mTorr. In another embodiment, the first deposition is performed using a pressure range of 50-200 mTorr and a second deposition step is performed using a process pressure of less than 50 mTorr.

Figure 2D:
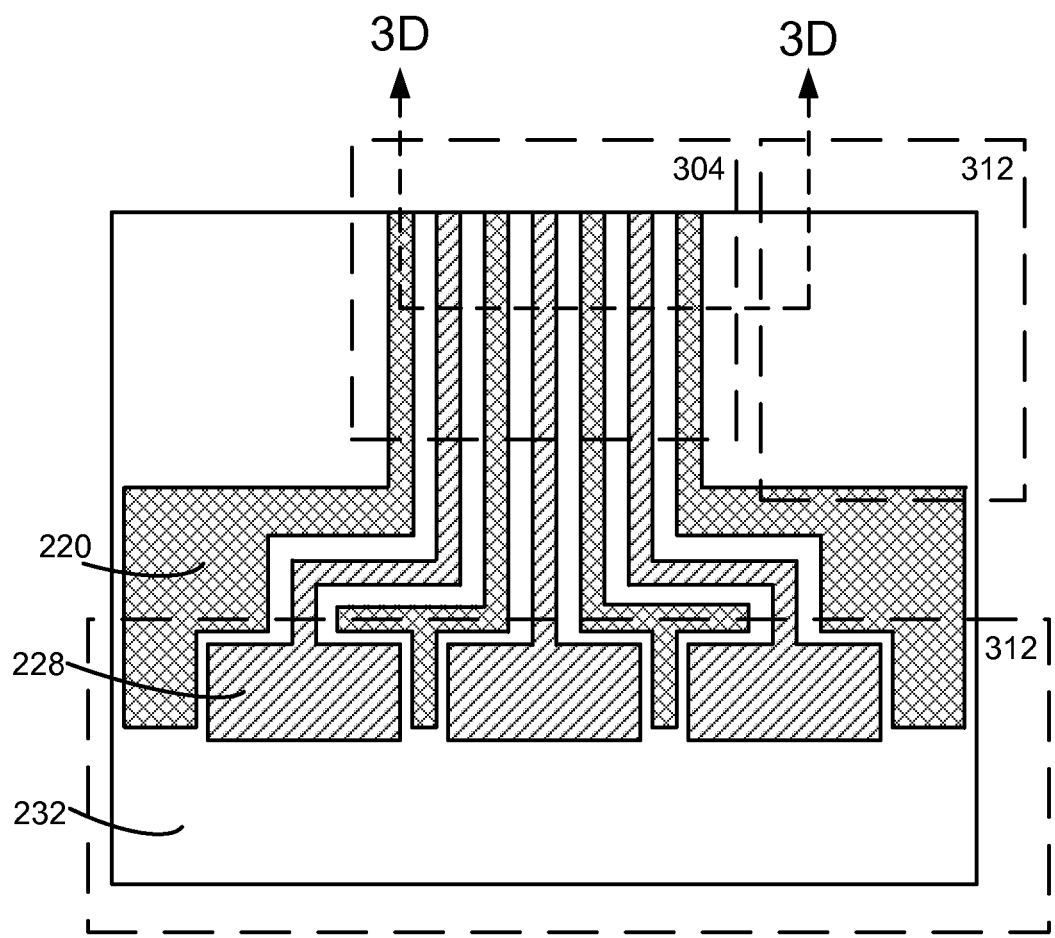
Figure 3D:
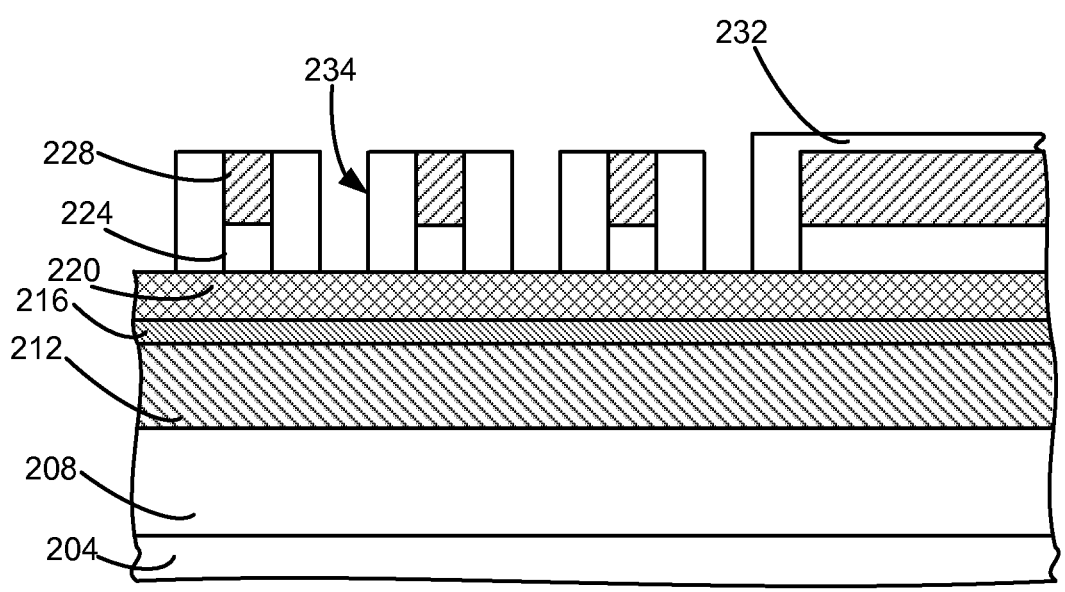

The deposited inorganic layer 232 is then etched back (step 116) to expose the organic mask in the array area, while leaving the organic mask in the periphery area unexposed. An example recipe for this process a process pressure of 2 mTorr is provided with 500 watts TCP, and a bias voltage of 200 volts. An etch back gas of 110 sccm $CHF_3$ is provided. An electrostatic chuck temperature of 10° C. is maintained. The process is maintained for 10 seconds. FIG. 2D is a top view and FIG. 3D is a cross-sectional view of part of the wafer after the deposited inorganic layer 232 has been etched back. The deposited inorganic layer at the bottom of the features and over the patterned organic mask 228 in the array area are etched away exposing the SiN layer 220 and the patterned organic mask 228 in the array area, while the patterned organic mask 228 in the periphery area remains unexposed. The etching back of the deposited inorganic layer 232 in the array area causes spacers 234 of the deposited inorganic layer to be formed adjacent to the lines of the organic mask in the array area.

Figure 2E:
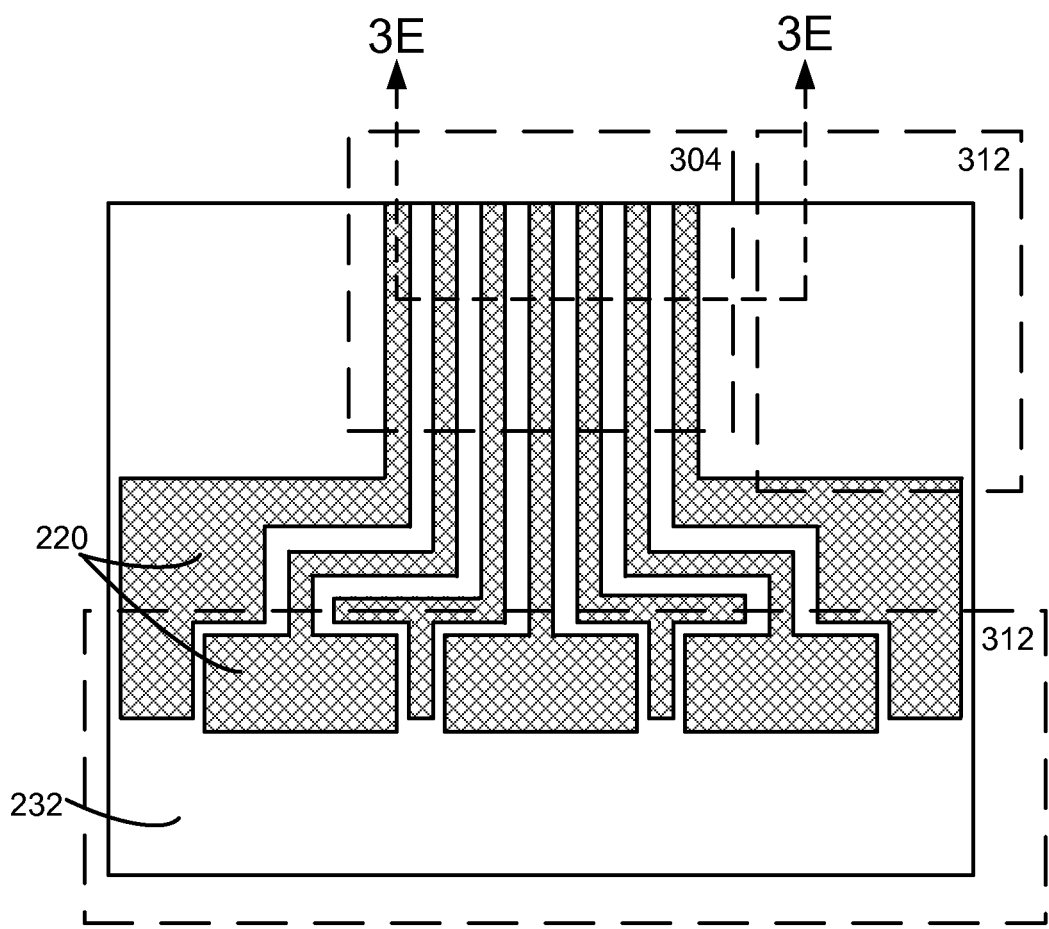
Figure 3E:
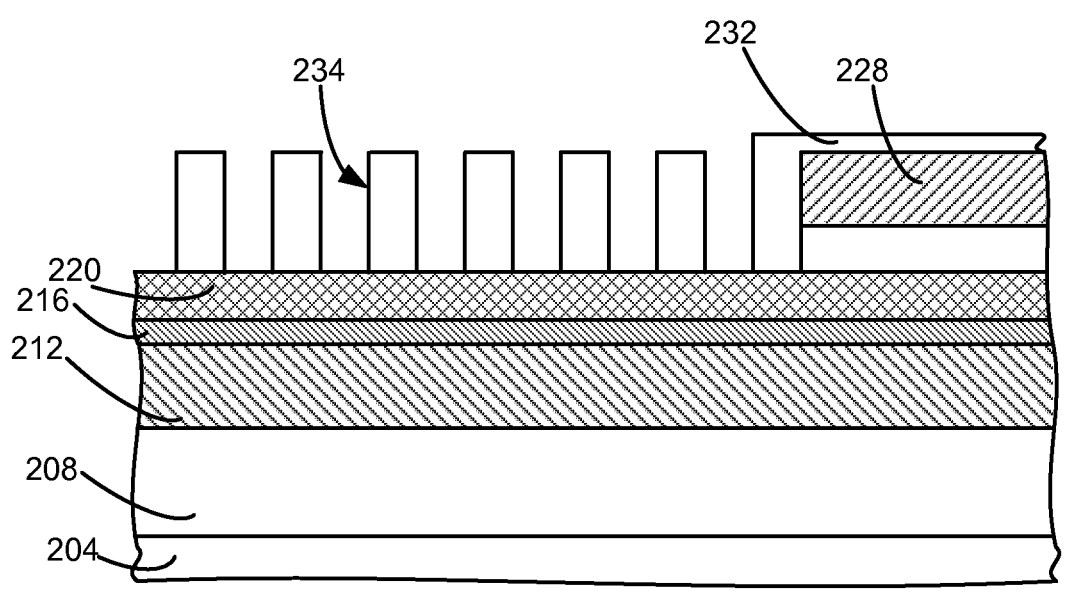

The exposed patterned organic mask 228, which is only exposed in the array area, is stripped, while the patterned organic mask in the periphery area is protected from the strip (step 120). Any BARC 224 that is exposed by the stripped organic mask 228 is also stripped in this embodiment. FIG. 2E is a top view and FIG. 3E is a cross-sectional view of part of the wafer after the patterned organic mask and BARC in the array area has been stripped. The stripping of the organic mask and BARC in the array area exposes more of the SiN layer 220 and leaves the inorganic spacers 234 of the deposited inorganic material 232 in the array area 304.

Figure 2F:
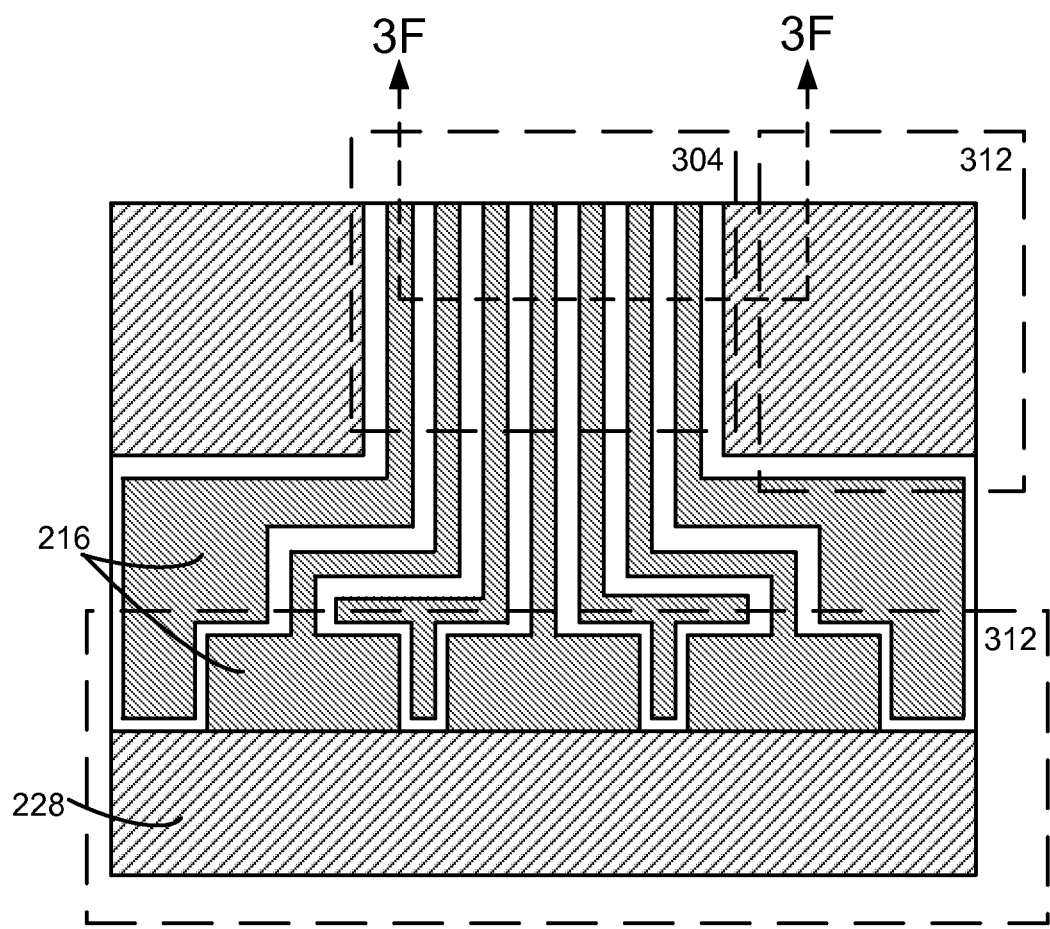
Figure 3F:
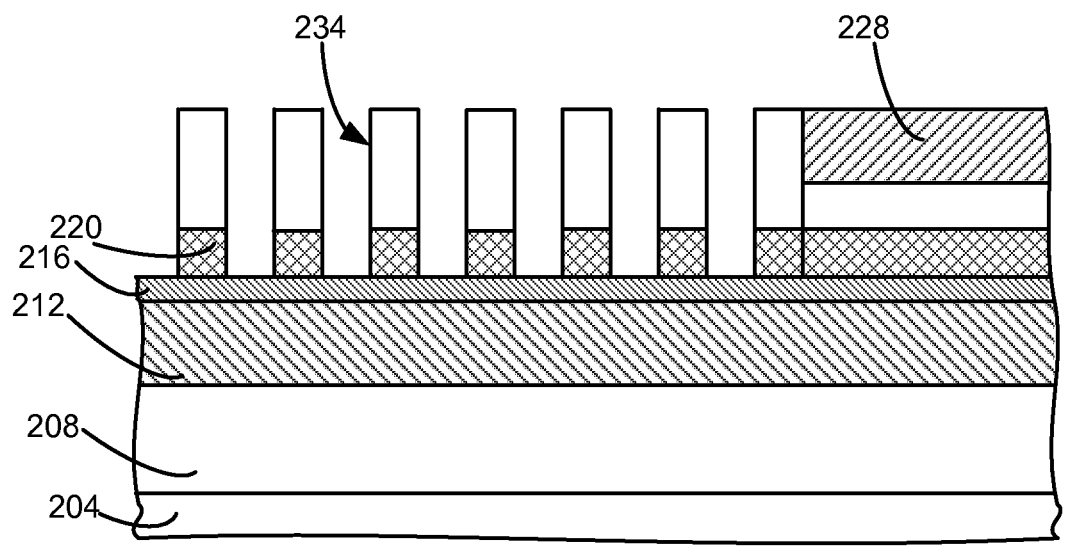

The SiN layer is then etched using the inorganic spacers 234 as a mask, in the array area (step 124). In the periphery area, the deposited inorganic layer is etched away. FIG. 2F is a top view and FIG. 3F is a cross-sectional view of part of the wafer after the SiN layer is etched. The pad oxide layer 216 is exposed when the SiN layer is etched away. When the deposited inorganic layer is etched away in the periphery area, the patterned organic mask 228 in the periphery area is exposed.

Figure 2G:
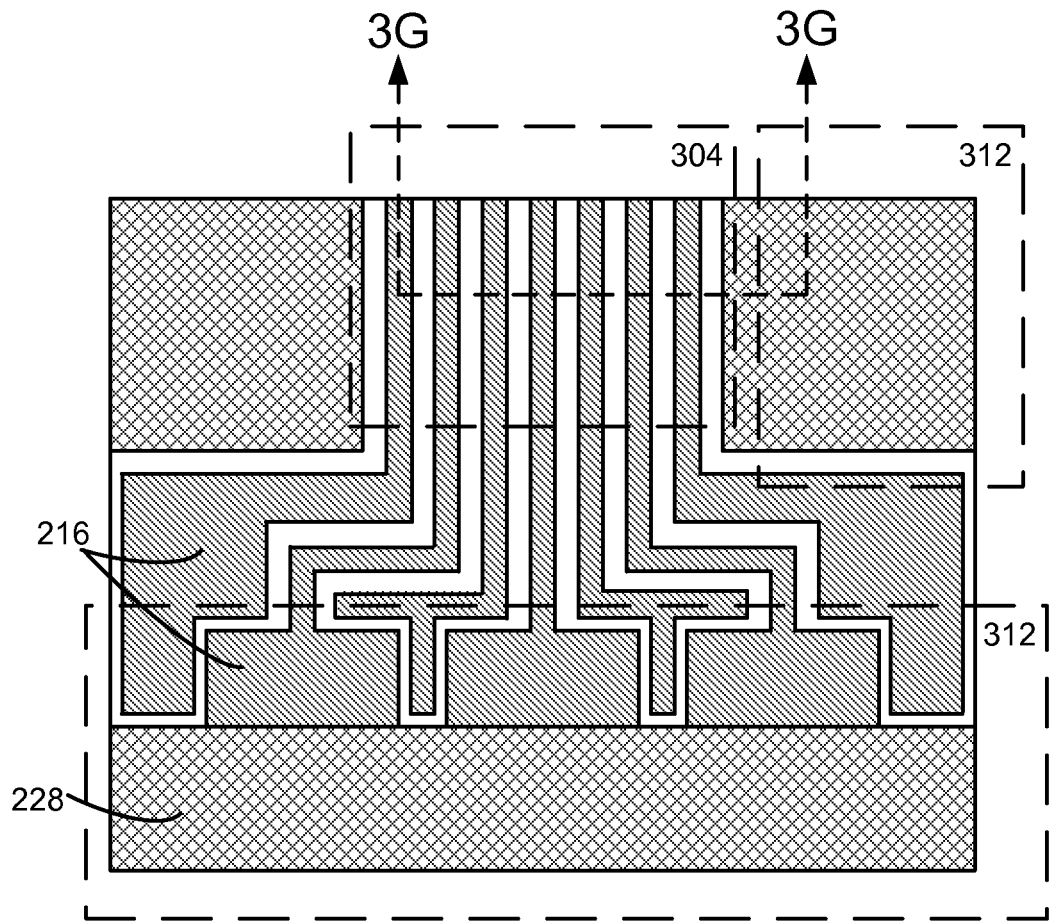
Figure 3G:
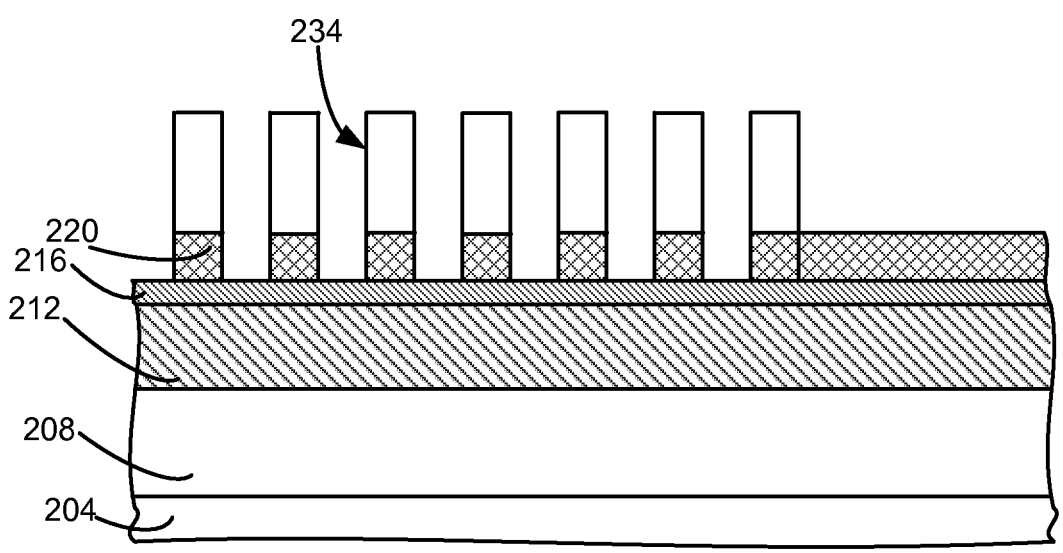

Next, a strip step will remove the remaining patterned organic mask 228 and BARC 224 in the periphery area (step 126). FIG. 2G is a top view and FIG. 3G is a cross-sectional view of part of the wafer after the patterned organic mask and BARC in the periphery area has been stripped. When the organic mask and BARC is stripped in the periphery area, the underlying SiN 220 is exposed.

Figure 2H:
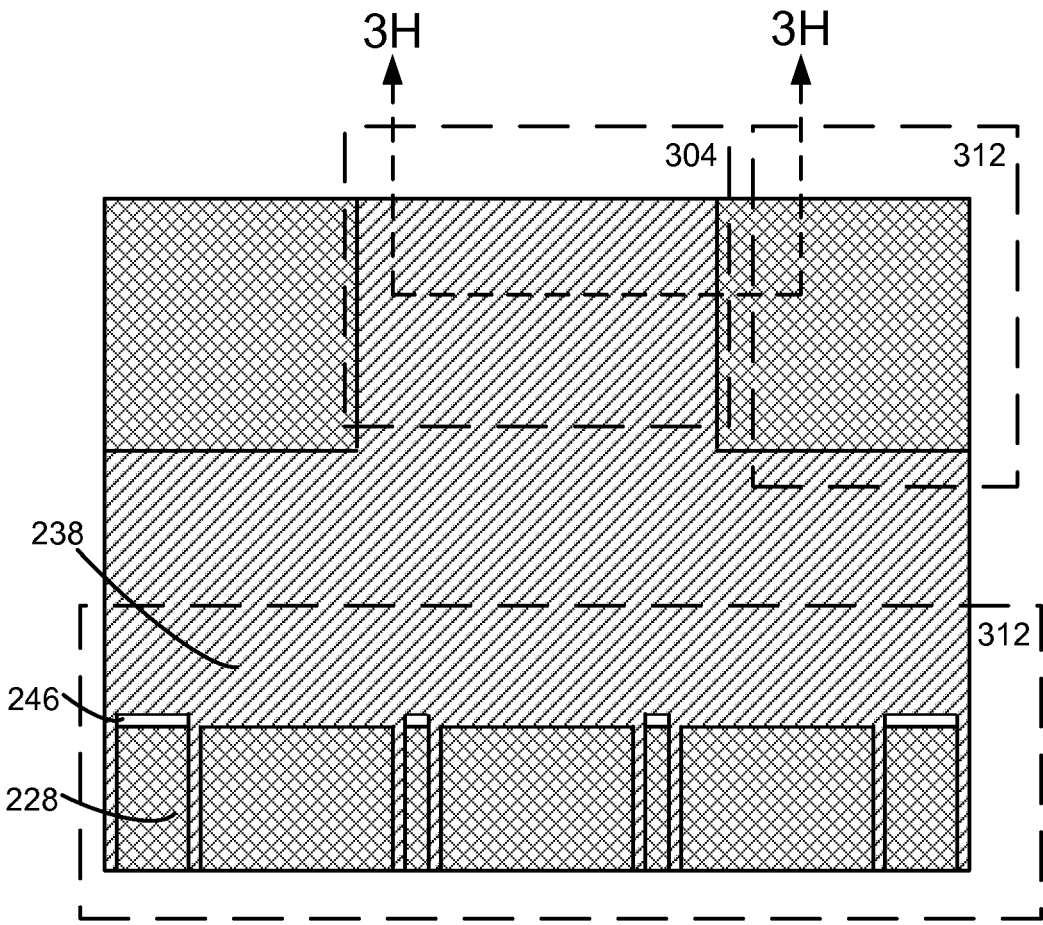
Figure 3H:
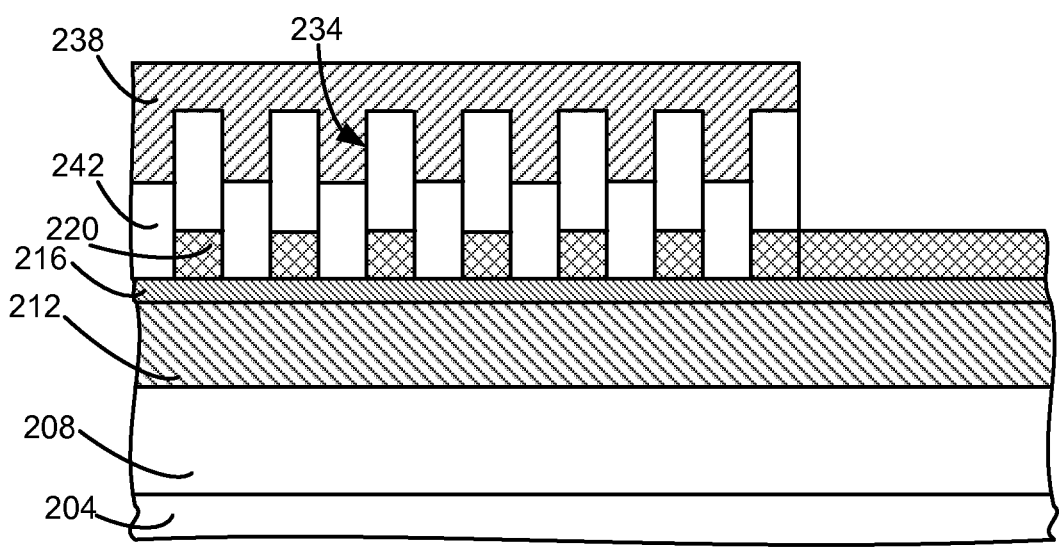

The wafer may then be removed from the chamber. An organic EOL and array protection mask is formed to cover the array area while forming patterns to expose the periphery area (step 128) while exposing the EOLs in the array area. FIG. 2H is a top view and FIG. 3H is a cross-sectional view of part of the wafer after the combined (integrated) EOL removal+ organic periphery mask 238 with a BARC 242 is formed.

Figure 2I:
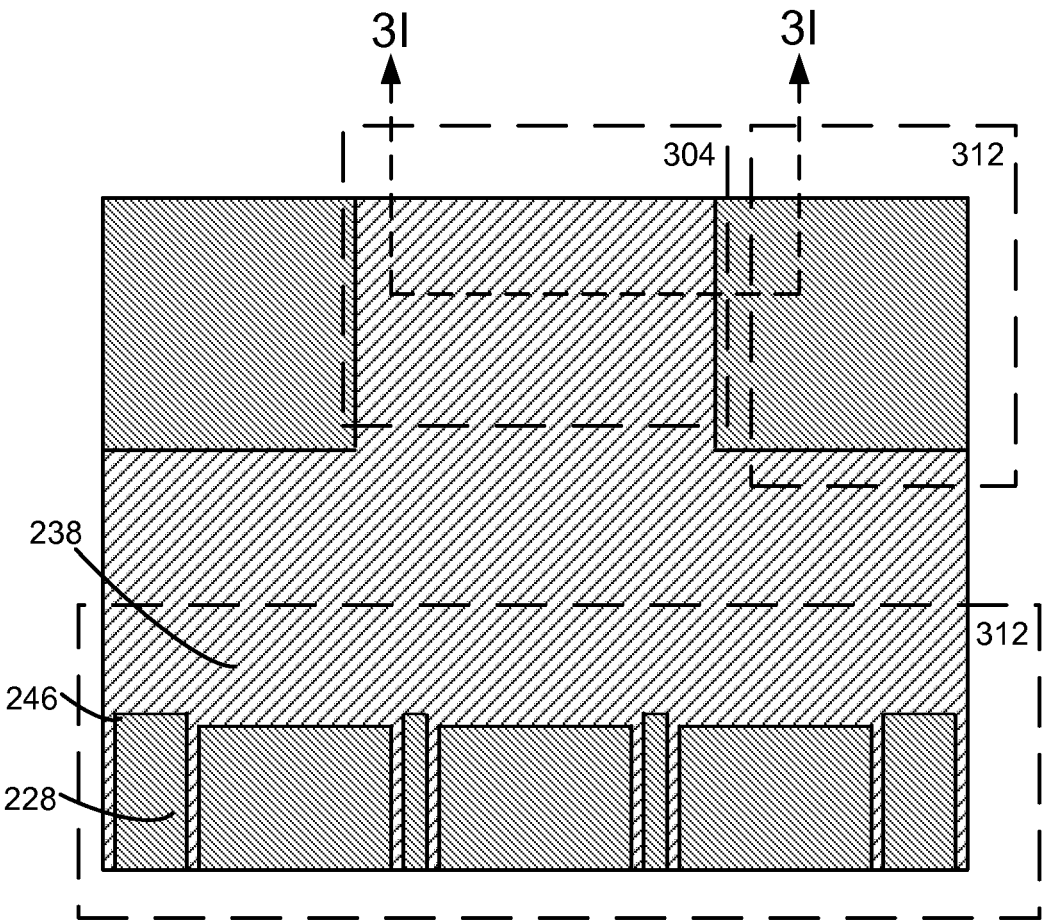
Figure 3I:
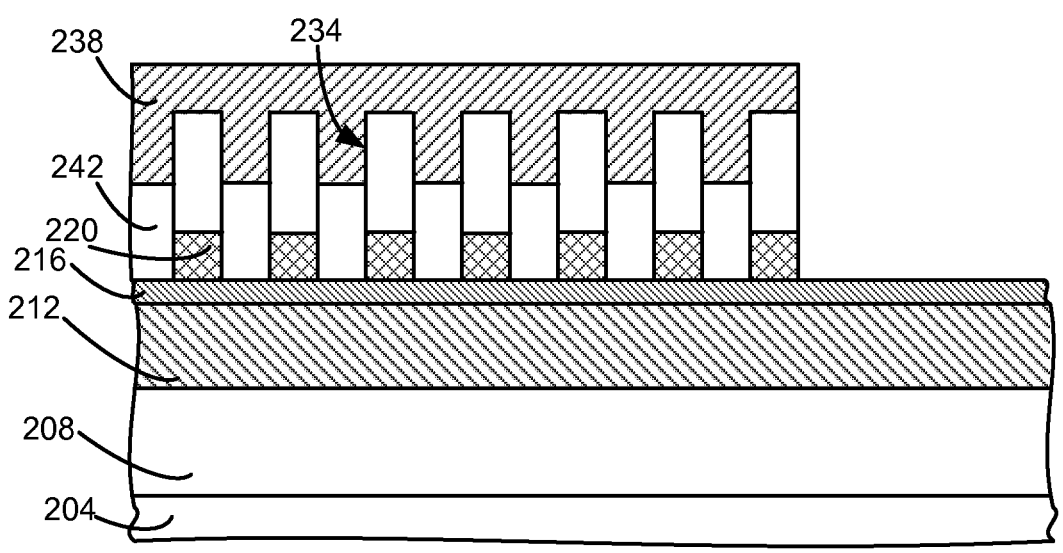

The wafer may then be placed in the same or a different plasma processing chamber. The exposed SiN layer 220 in the periphery area and end of lines (EOL) 246 in the array area, shown in FIG. 2H, formed from the deposited inorganic layer, are etched away using an inorganic material etch (step 132), which exposes the underlying pad oxide layer 216. FIG. 2I is a top view and FIG. 3I is a cross-sectional view of part of the wafer after the exposed SiN layer in the periphery area and the EOL in the array area have been etched away.

Figure 2J:
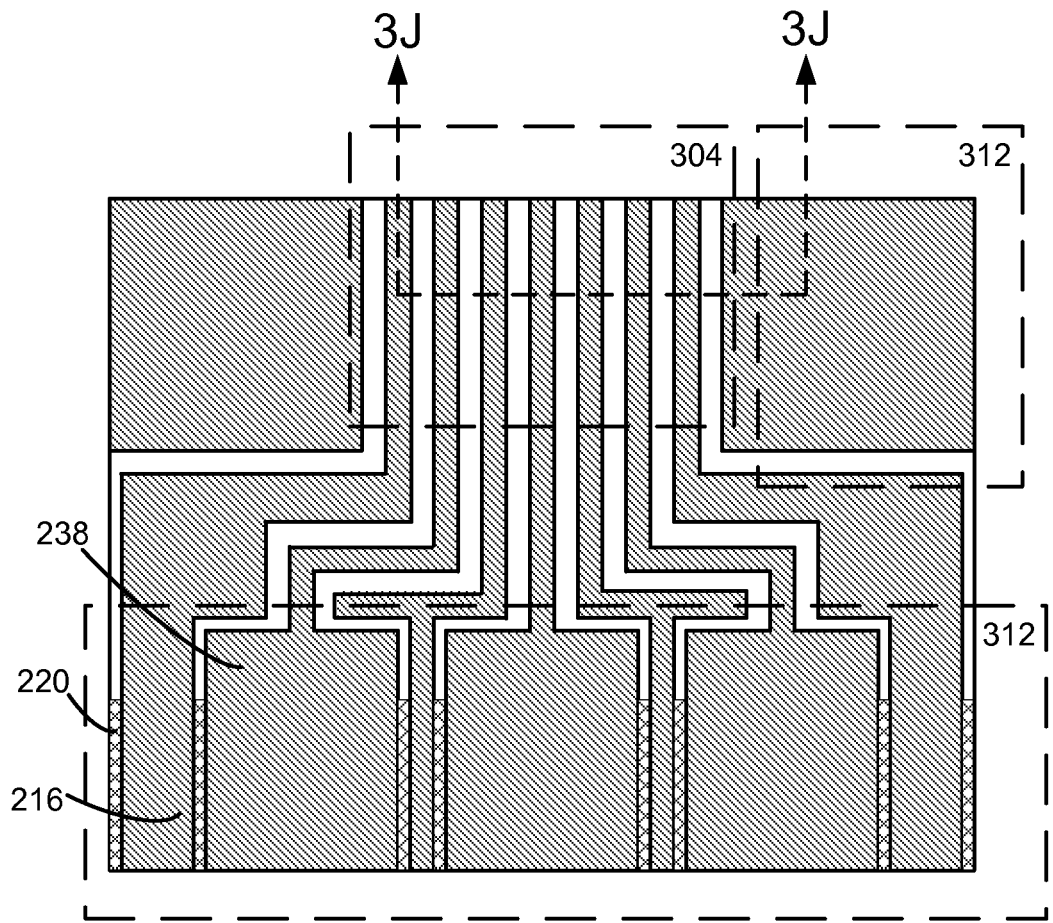
Figure 3J:
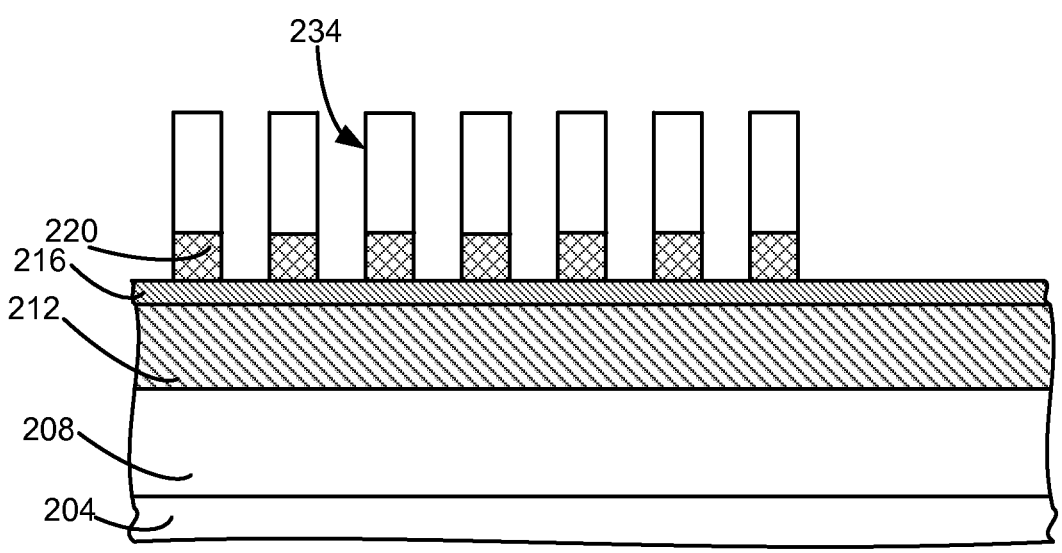

The organic EOL and array protection mask and BARC are stripped (step 136). FIG. 2J is a top view and FIG. 3J is a cross-sectional view of part of the wafer after the EOL and array protection mask and the BARC have been stripped.

Figure 2K:
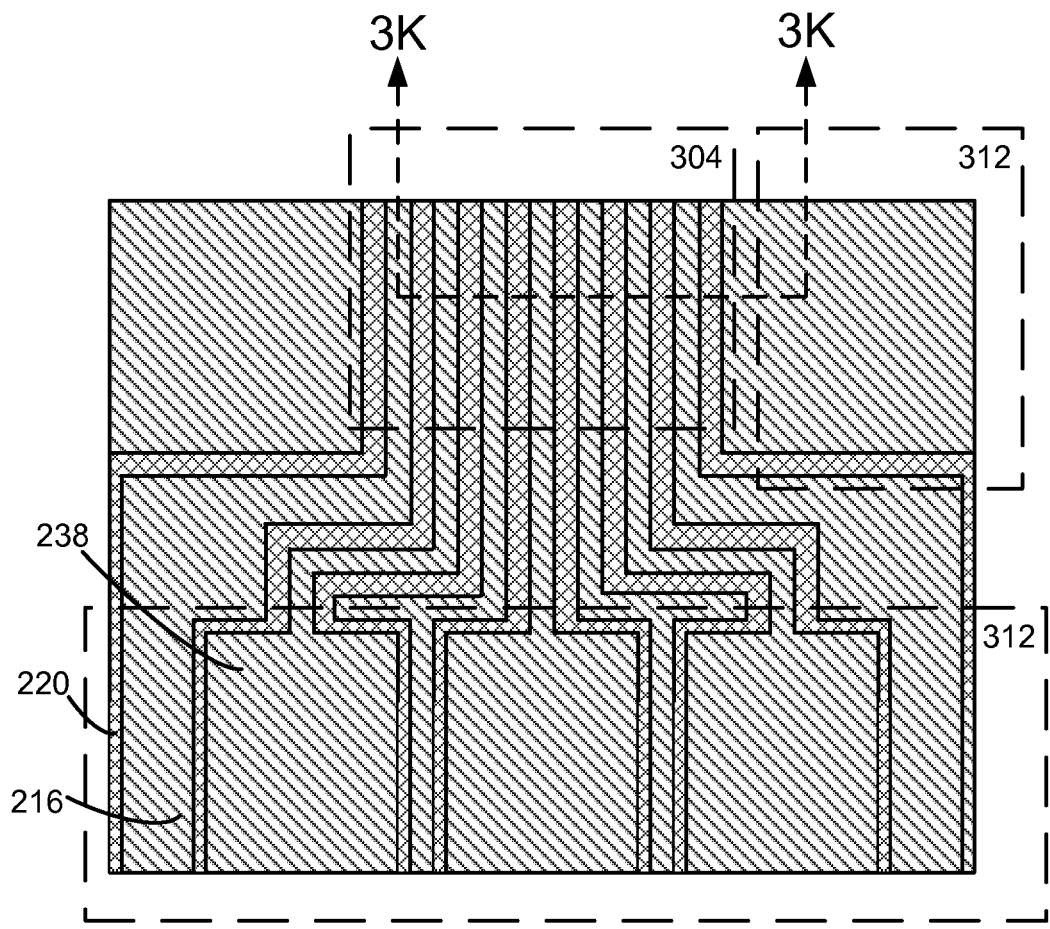
Figure 3K:
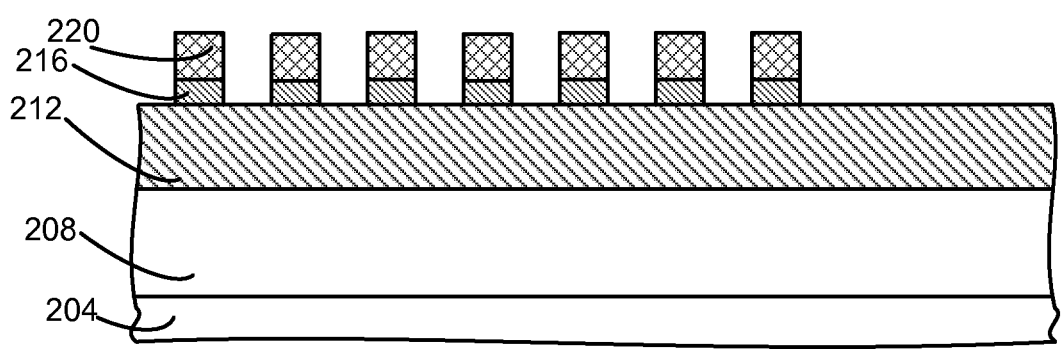

An underlying etch layer is then etched (step 140). In this example, the immediate underlying etch layer is the pad oxide layer. In this example, the pad oxide layer etch also removes the remaining oxide spacers. FIG. 2K is a top view and FIG. 3K is a cross-sectional view of part of the wafer after the underlying etch layer is etched using the SiN layer 220 as a hardmask. The etching of the pad oxide layer exposes the underlying amorphous carbon layer such as ACL or Spin-on-Carbon (SoC) 212.

Figure 2L:
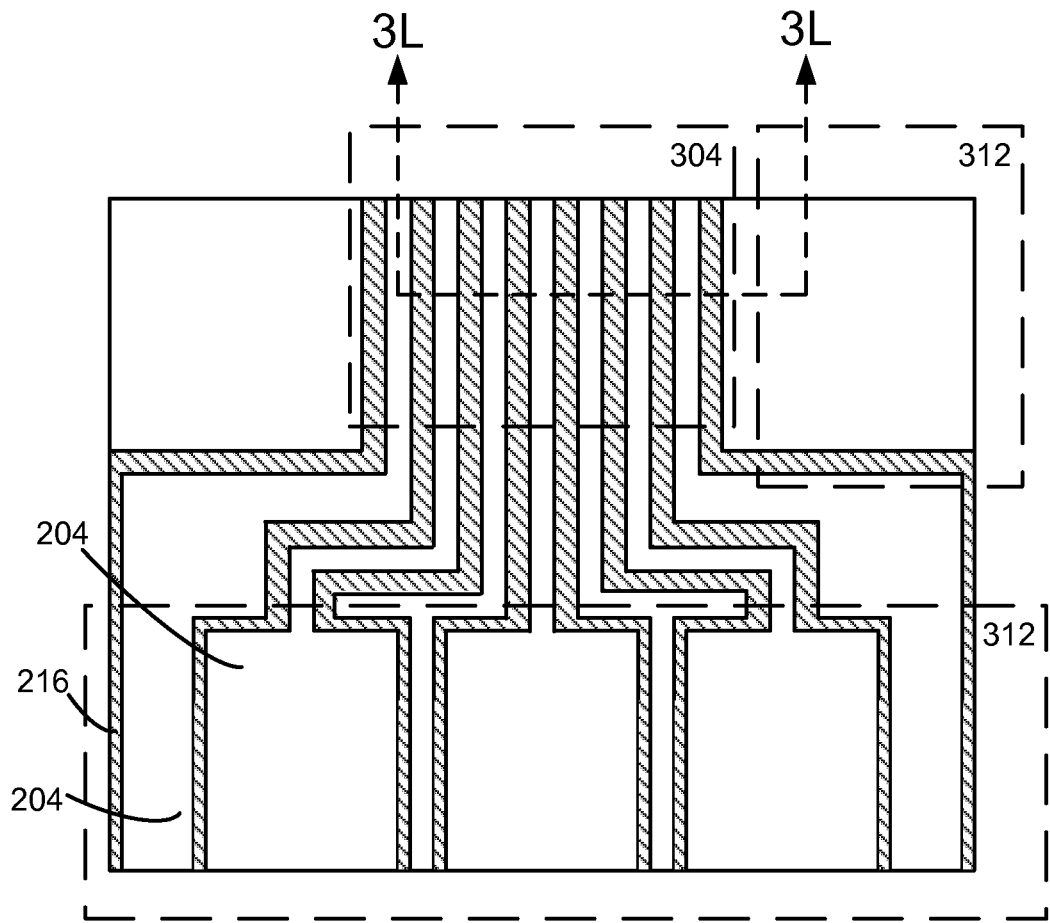
Figure 3L:
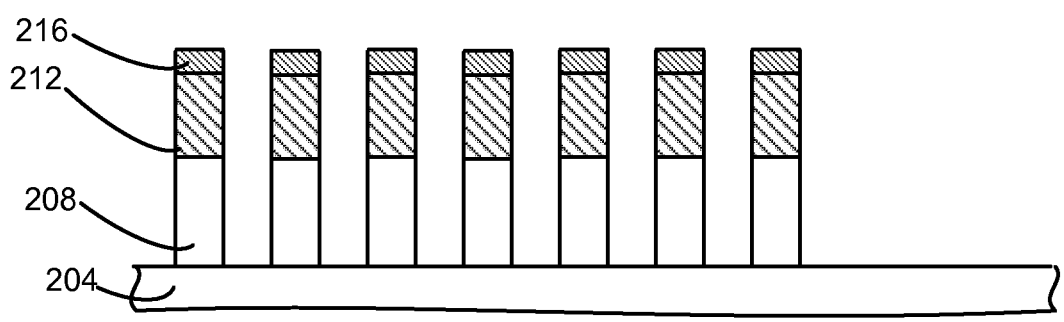

In this example, the pad oxide layer is used as a hard mask to etch an underlying amorphous carbon layer 212. The amorphous carbon layer is then used as a mask to etch an underlying SiN layer 208. FIG. 2L is a top view and FIG. 3L is a cross-sectional view of part of the wafer after the underlying SiN layer 208 has been etched. The etching of the SiN layer leaves the silicon layer of the silicon wafer 204 exposed. In other embodiments, the silicon layer may be another intermediate layer above the silicon wafer.

This embodiment allows a deposition where the thickness of the deposited layer is thicker over the periphery area than over the array area. This allows an etch back that exposes the mask in the array area without exposing the mask in the periphery area.

This embodiment also allows a single periphery mask and end of line etch mask formed as a single mask, instead of requiring two separate masks.

By eliminating a mask, the overall cost is reduced by the litho and subsequent etch and strip steps.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. An apparatus for forming an array area with a surrounding periphery area, wherein a substrate is disposed under an etch layer, which is disposed under a patterned organic mask defining the array area and the periphery area, comprising:
   a plasma processing chamber, comprising:
      a chamber wall forming a plasma processing chamber enclosure;
      a substrate support for supporting a substrate within the plasma processing chamber enclosure;
      a pressure regulator for regulating the pressure in the plasma processing chamber enclosure;
      at least one antenna for providing power to the plasma processing chamber enclosure for sustaining a plasma;
      at least one bias electrode for providing a bias voltage;
      a gas inlet for providing gas into the plasma processing chamber enclosure; and
      a gas outlet for exhausting gas from the plasma processing chamber enclosure;
   a gas source in fluid connection with the gas inlet, comprising:
      a trimming gas source;
      an inorganic layer deposition gas source;
      an etch back gas source; and
      a stripping gas source;

a controller controllably connected to the gas source, the at least one antenna, and at least one bias electrode, comprising:
at least one processor; and
non-transitory computer readable media, comprising
computer readable code for trimming the patterned organic mask;
computer readable code for depositing an inorganic layer over the patterned organic mask where a thickness of the inorganic layer over the periphery area of the organic mask is greater than a thickness of the inorganic layer over the array area of the organic mask;
computer readable code for etching back the inorganic layer to expose the organic mask and form inorganic spacers in the array area, while leaving the organic mask in the periphery area unexposed; and
computer readable code for stripping the organic mask exposed in the array area, while leaving the inorganic spacers in place and protecting the organic mask in the periphery area.

2. The apparatus, as recited in claim 1, wherein the computer readable code for depositing an inorganic layer over the patterned organic mask where a thickness of the inorganic layer over the periphery area of the organic mask is greater than a thickness of the inorganic layer over the array area of the organic mask, comprises:
computer readable code for depositing an inorganic layer over the patterned organic mask using a process with a process pressure of greater than 50 mTorr, comprising computer readable code for providing a deposition gas from the inorganic layer deposition gas source;
computer readable code for setting the pressure regulator to provide a pressure of greater than 50 mTorr; and
computer readable code for using the antenna for forming a plasma from the deposition gas; and
computer readable code for depositing an inorganic layer over the patterned organic mask using a process with a process pressure of less than 10 mTorr, comprising:
computer readable code for providing the deposition gas from the inorganic layer deposition gas source;
computer readable code for setting the pressure regulator to provide a pressure of less than 10 mTorr; and
computer readable code for using the antenna for forming a plasma from the deposition gas.

3. The apparatus, as recited in claim 1, wherein the inorganic layer is a first inorganic layer wherein a second inorganic layer is disposed between the organic mask and the etch layer, further comprising:
computer readable code for etching the array area of the second inorganic layer through spacers formed from sidewalls of the first inorganic layer, wherein the etching the second inorganic layer also etches away the first inorganic layer on top of the periphery area;
computer readable code for removing the patterned organic mask in the periphery area;
forming a combined organic end of line (EOL) and periphery mask, which covers the array area, while exposing end of lines (EOL) in the array area and the periphery area;
computer readable code for etching the end of lines and the periphery area of the second inorganic layer; and
computer readable code for stripping the organic EOL and periphery mask.

4. The apparatus, as recited in claim 3, further comprising computer readable code for etching the substrate.

5. The apparatus, as recited in claim 4, wherein the computer readable code for depositing the first inorganic layer, comprises:
computer readable code for depositing a first part of the first inorganic layer over the patterned organic mask using a process with a process pressure of greater than 50 mTorr; and
computer readable code for depositing a second part of the first inorganic layer over the patterned organic mask using a process with a process pressure of less than 10 mTorr.

6. The apparatus, as recited in claim 4, wherein the computer readable code for depositing the first inorganic layer, comprises:
computer readable code for providing a first deposition that deposits the first inorganic layer over the patterned mask over the periphery area at a thickness that is thicker than the film deposited on top of patterned mask over the array area and bottom of space between array photoresist patterns; and
computer readable code for providing a second deposition wherein an additional deposition by the second step over the patterned mask over the periphery area has about the same thickness on top of the patterned mask over the array area, bottom of space between array patterns and sidewalls of the organic mask.

7. The apparatus, as recited in claim 6, wherein the etching the end of lines and the periphery area, the stripping the organic EOL and periphery mask, and the etching the substrate are performed in the plasma processing chamber.

8. The apparatus, as recited in claim 7, wherein the substrate is over a silicon wafer.

9. The apparatus, as recited in claim 8, wherein the organic mask is photoresist, and wherein the first inorganic layer comprises a silicon oxide based material.

10. The apparatus, as recited in claim 9, wherein the second inorganic layer disposed between the organic mask and the etch layer comprises silicon oxide.

11. The apparatus, as recited in claim 10, wherein an amorphous carbon layer is disposed between the second inorganic layer and the etch layer.

12. The apparatus, as recited in claim 4, wherein the trimming, the depositing the first inorganic layer, the etching back the second inorganic layer, the stripping the organic mask, the etching the array area, and the removing the patterned organic mask in the periphery area are performed in the plasma processing chamber.

13. The apparatus, as recited in claim 1, wherein the computer readable code for depositing the inorganic layer, comprises:
computer readable code for depositing a first part of the first inorganic layer over the patterned organic mask using a process with a process pressure of greater than 50 mTorr; and
computer readable code for depositing a second part of the first inorganic layer over the patterned organic mask using a process with a process pressure of less than 10 mTorr.

14. The apparatus, as recited in claim 13, wherein the only difference between the computer readable code for depositing an inorganic layer over the patterned organic mask using a process pressure of greater than 50 mTorr and the computer readable code for depositing an inorganic layer over the patterned organic mask using a process pressure of less than 10 mTorr is the difference in process pressure, so that all other processing parameters are held constant.

15. The apparatus, as recited in claim 13, wherein the computer readable code for depositing an inorganic layer over the patterned organic mask using a process pressure of greater than 50 mTorr and the computer readable code for depositing an inorganic layer over the patterned organic mask using a process pressure of less than 10 mTorr use a same deposition gas chemistry.

16. The apparatus, as recited in claim 1, wherein the computer readable code for depositing the inorganic layer, comprises:

- computer readable code for providing a first deposition that deposits the inorganic layer over the patterned mask over the periphery area at a thickness that is thicker than the film deposited on top of the patterned mask over the array area and bottom of space between array photoresist patterns; and
- computer readable code for providing a second deposition wherein an additional deposition by the second step over the patterned mask over the periphery area has about the same thickness on top of the patterned mask over the array area, bottom of space between array patterns and sidewalls of the organic mask.

17. The apparatus, as recited in claim 1, wherein the trimming, the depositing the inorganic layer, the etching back the inorganic layer, the stripping the organic mask, the etching the array area, and the removing the patterned organic mask in the periphery area are performed in the plasma processing chamber.

* * * * *